United States Statutory Invention Registration [19]

[11] Reg. Number: H73

Claasen et al. [45] Published: Jun. 3, 1986

[54] INTEGRATED CIRCUIT PACKAGES

[75] Inventors: Kenneth K. Claasen, Lower Nazareth Township, Northampton County; Ronald N. Graver; Frank P. Pelletier, both of Allentown; Kurt M. Striny, Emmaus; Ronald J. Wozniak, Allentown, all of Pa.

[73] Assignee: AT&T Bell Laboratories, Murray Hill, N.J.

[21] Appl. No.: 526,413

[22] Filed: Aug. 25, 1983

[51] Int. Cl.[4] ..... H01L 23/28
[52] U.S. Cl. ..... 357/72; 357/67
[58] Field of Search ..... 357/72, 81, 67

[56] References Cited

U.S. PATENT DOCUMENTS

| | | | |
|---|---|---|---|
| 2,850,687 | 9/1958 | Hammes | 357/72 |
| 3,670,091 | 6/1972 | Frantz et al. | 357/72 |
| 3,763,403 | 10/1973 | Lootens | 357/81 |
| 3,839,660 | 10/1974 | Stryker | 357/72 |
| 4,048,670 | 9/1977 | Eysermans | 357/72 |
| 4,169,271 | 9/1979 | Saitoh | 357/72 |

FOREIGN PATENT DOCUMENTS

| | | | |
|---|---|---|---|
| 0159484 | 3/1983 | Fed. Rep. of Germany | 357/72 |

*Primary Examiner*—S. C. Buczinksi
*Assistant Examiner*—Linda J. Wallace
*Attorney, Agent, or Firm*—Lester H. Birnbaum

[57] ABSTRACT

A package for wire-bonded semiconductor integrated circuit chips is disclosed. The chip is covered by a protective layer of material such as room temperature vulcanizing silicone rubber. The thickness of the layer is such that it covers a portion of the arched wires, thereby concentrating the stresses away from the wire-ball bond interfaces. The chip is encapsulated in a plastic material while providing an air gap between the plastic and protective layer.

7 Claims, 2 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

BEST AVAILABLE COPY

INTEGRATED CIRCUIT PACKAGES

BACKGROUND OF THE INVENTION

This invention relates to semiconductor devices and in particular to a package including wire-bonded semiconductor chips.

In the packaging of semiconductor integrated circuit (IC) chips, a dual-in-line (DIP) package is commonly employed. In such packages, the chip is mounted on a metal plate of a lead frame and the pads on the chip are electrically interconnected to the metal fingers of the lead frame by wire bonds. The chip is then encapsulated in a plastic material and the leads separated from the lead frame to form the discrete package.

Although such packages are generally adequate, a persistent yield and reliability problem has resulted from the tendency of the wire bonds to break due to stresses from the plastic encapsulant's expansion and contraction during temperature variations.

It is therefore a primary objective of the invention to provide a semiconductor chip package with improved mechanical reliability.

SUMMARY OF THE INVENTION

This and other objectives are achieved in accordance with the invention which is a semiconductor device comprising a semiconductor chip electrically interconnected to metal leads by means of wires extending from pads on the chip to the leads. The wires include arched portions. A thick, protective layer, which comprises a material having a large expansion coefficient and a low shear modulus, is formed over the surface of the chip to a thickness which covers at least the part of the arched portion of the wires where the slope of the wires is reduced to less than 45° relative to the semiconductor chip surface. A plastic encapsulating material surrounds the chip, protective layer and a portion of the leads.

BRIEF DESCRIPTION OF THE DRAWING

These and other features of the invention are delineated in detail in the following description. In the drawing.

It will be appreciated that for purposes of illustration these figures are not necessarily drawn to scale.

DETAILED DESCRIPTION

Figure 1:
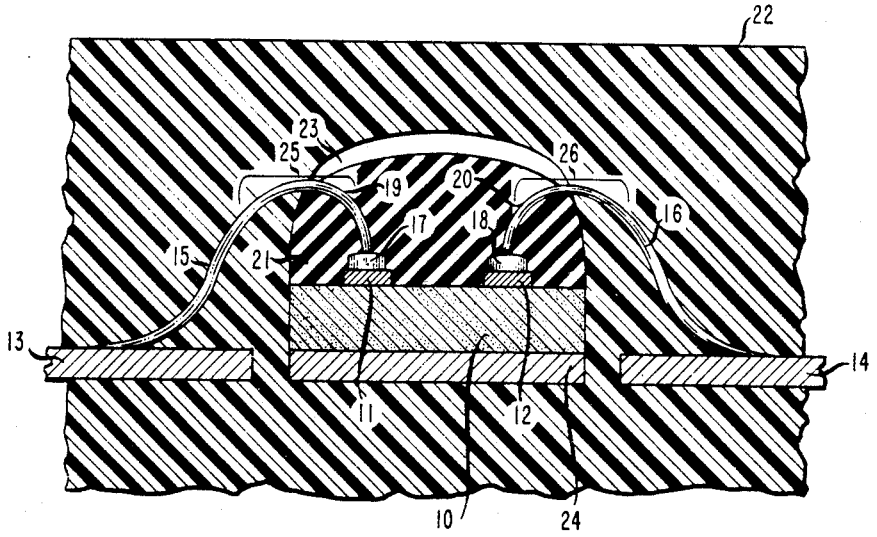
FIG. 1 is a cross-sectional view of a semiconductor device in accordance with one embodiment of the invention.

The basic principles of the invention will be described with reference to the particular embodiment illustrated in FIG. 1. A semiconductor IC chip, 10, is provided with bonding pads, 11 and 12, on one major surface. Of course, it will be appreciated that the surface typically includes many more bonding pads as well as circuit elements which are not shown for the sake of clarity in the illustration. The pads, 11 and 12, are electrically interconnected to leads, 13 and 14, respectively, which extend out from the package on two sides of the chip for connection to external circuitry. The electrical interconnection is made by wires, 15 and 16, which are bonded to their respective pads, 11 and 12, by means of standard ball bonds, 17 and 18, which were formed from the wires by heating according to standard techniques. The opposite major surface of the chip was bonded to a metal plate (die support paddle), 24, which is part of the lead frame.

In a particular example, the chip was 180 mils long, 180 mils wide and 10 mils thick. The wires were approximately 60 mils long and the leads were approximately 750 mils long. The pads were approximately 5 mils × 5 mils.

By virtue of the geometry of the package, each wire includes an arch portion, 25 and 26, with a portion of the arch, 19 and 20, where the slope of the wire goes from essentially vertical (typically approximately 100° to the surface to a slope of less than 45° to the semiconductor surface.

The chip, 10, along with the wires, 15 and 16, and at least a portion of the leads, 13 and 14, are encapsulated in a plastic material, 22, to form a dual-in-line package.

In accordance with a main feature of the invention, the semiconductor chip, prior to encapsulation, is covered by a thick, protective layer, 21, which in this example is RTV silicone rubber. The RTV coating of the present invention is thick enough, in this example approximately 10 mils in the area over the pads, so as to cover the portions, 19 and 20, of the arched portions of wires. We have found that use of such a thick coating greatly increases the mechanical reliability of the package by decreasing the strains in the wires and by concentrating the stresses on the wires away from the more fragile wire-ball bond interfaces where stresses in prior art packages caused breaking of the wire. The stresses and strains in the wire are caused by the expansion and the contraction of the wires and materials, 10 and 22.

Figure 2:
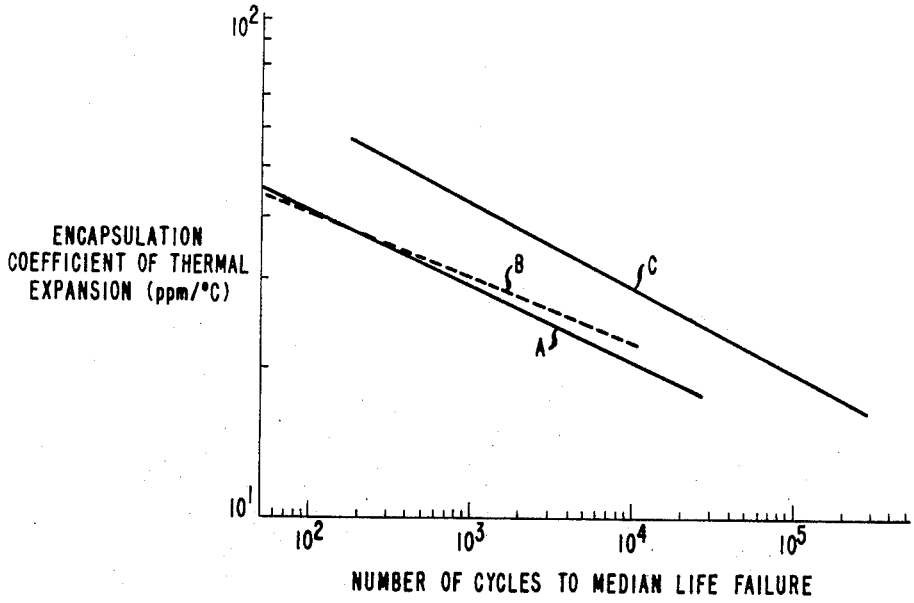
FIG. 2 is a graph showing the reliability of devices in accordance with the same embodiment of the invention as compared to other devices.

FIG. 2 illustrates the increased reliability of the present package in terms of the number of cycles to median life failure for three types of packages when subjected to temperature cycles of −40° C. to 150° C. of approximately 10 minutes per cycle. All packages were 40 lead DIP packages with identical chips encapsulated in plastic. However, one type (curve A) had no RTV applied, one type (curve B) had a thin (1–2 mil) layer of RTV applied and the third type (curve C) had RTV applied in accordance with the invention to a cured thickness of 10 mils in the area over the chip pads. (It will be appreciated that the RTV has a domed shape with a maximum thickness over the middle portion of the chip. For the purposes of this invention, the important thickness is that over the area of the contact pads, 11 and 12, which are situated at the edges of the chip. Typically, the maximum height of RTV is approximately 25 mils over the middle of the chip.) The ordinate shows the coefficient of thermal expansion of different plastic encapsulants employed and the abscissa shows the number of cycles to failure of the median number of devices in each group tested (a failure for a device occurs when one of the wire bonds break). A typical sample size was approximately 60 devices.

It will be noted that three different encapsulants were employed for all three of the device types. In each case, the type with the thick RTV applied (curve C) demonstrated an improvement of at least a factor of 8 in cycles to median life failure and therefore a corresponding improvement in estimated life years.

In a particular example, the RTV was a standard, commercially available type, such as that sold by Dow Corning under the designation DC6550 which was diluted with xylene. The RTV was applied with a dispenser and cured at room temperature for 2 hours and at 125° C. for 6–8 hours. The plastic encapsulant was also a standard, commercially available material such as that sold by Plascon under the designation 3200 LS. The plastic was molded around the structure at a temperature of 150°–175° C. for 2–3 minutes in a standard transfer molding press. As the package cools down to room temperature, the RTV shrinks and an air gap, 23, was formed between the RTV and encapsulant. The formation of this air gap is important since it relieves pressure on the wire bonds by giving some room for mobility of the RTV layer. Preferably, the air gap has a dimension in the range 1–5 mils at room temperature over the area of the chip pads.

It will be appreciated tht protective layers other than RTV silicone rubber may be utilized. In order to produce the results of the invention, the layer should preferably have a large expansion coefficient to form the air gap and a low shear modulus so that movement of the layer causes a minimum stress on the wires. It is recommended that the expansion coefficient be at least 200ppm/°C. and the shear modulus be no greater than 100 psi at −40° C. to 150° C. In general, the thickness of the protective layer should be in the range 6–15 mils over the area of the chip pads.

The plastic encapsulant could be any material usually used for encapsulating integrated circuits. A low expansion coefficient material is preferred, and the encapsulant will typically have an expansion coefficient which is less than 25 ppm/°C. from −40° C. to 125° C.

Various additional modifications will become apparent to those skilled in the art. All such variations which basically rely on the teachings through which the invention had advanced the art are properly considered within the spirit and scope of the invention.

What is claimed is:

1. A semiconductor device comprising:

a semiconductor chip electrically interconnected to metal leads by means of wires ball bonded to pads on a surface of the chip and extending from the pads to the leads, said wires including arched portions of a varying slope;

a thick protective layer formed over and limited to said surface of the chip and including areas over the pads, said layer formed to a thickness which covers at least a part of the arched portions where the slope of the wires is reduced to less than 45° relative to the chip surface, but does not cover the entire length of the wires, said layer comprising a material having a large expansion coefficient and low shear modulus; and a plastic encapsulating material surrounding said chip, protective layer, a portion of said leads, and covering a portion of said wires.

2. The device according to claim 1 wherein the protective layer is an RTV silicone rubber.

3. The device according to claim 1 wherein the thickness of the protective layer is within the range 6–15 mils in the areas over the chip pads.

4. The device according to claim 1 wherein an air gap is formed between the protective layer and plastic encapsulating material having a width in the range 1–5 mils in the areas over the chip pads.

5. The device according to claim 1 wherein the protective layer material has an expansion coefficient of greater than 200 ppm/°C. and a shear modulus of less than 100 psi at −40° C. to 150° C.

6. The device according to claim 1 wherein the plastic encapsulating material comprises a material having a coefficient of expansion less than 25 ppm/°C. at −40° C. to 125° C.

7. A semiconductor device comprising:

a semiconductor chip electrically interconnected to metal leads by means of wires ball-bonded to pads on a surface of the chips and extending from the pads to the leads, said wires including arched portions;

a layer of RTV silicone rubber formed over and limited to said surface of the chip and including areas over the chip pads, said RTV layer formed to a cured thickness within the range 6–15 mils in the areas over the chip pads so that the RTV layer covers only a portion of the wires, said RTV layer having an expansion coefficient of at least 200 ppm/°C. at −40° C. to 150° C. and a shear modulus of less than 100 psi from −40° C. to 150° C.; and a plastic encapsulating material surrounding said chip, RTV layer, a portion of said leads, and covering a portion of the wires, with a gap between the RTV layer and encapsulant within the range 1–5 mils at room temperature in the areas over the chip pads.

* * * * *